US008264082B2

(12) United States Patent
de Frésart et al.

(10) Patent No.: US 8,264,082 B2
(45) Date of Patent: Sep. 11, 2012

(54) SEMICONDUCTOR DEVICES WITH LOW RESISTANCE BACK-SIDE COUPLING

(75) Inventors: Edouard de Frésart, Tempe, AZ (US); Robert W. Baird, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/208,221

(22) Filed: Aug. 11, 2011

(65) Prior Publication Data

US 2011/0291278 A1  Dec. 1, 2011

Related U.S. Application Data

(62) Division of application No. 12/564,307, filed on Sep. 22, 2009, now Pat. No. 8,021,926.

(51) Int. Cl.
*H01L 23/48* (2006.01)
*H01L 23/52* (2006.01)
*H01L 29/40* (2006.01)

(52) U.S. Cl. ............... 257/751; 257/774; 257/E23.011

(58) Field of Classification Search ............ 257/751, 257/774, E23.011
See application file for complete search history.

(56) References Cited

U.S. PATENT DOCUMENTS

| 6,143,629 | A | 11/2000 | Sato |
| 6,432,724 | B1 | 8/2002 | Ahn et al. |
| 2011/0133335 | A1 | 6/2011 | Chen |
| 2011/0136342 | A1 | 6/2011 | Harada et al. |

OTHER PUBLICATIONS

Wang, L. et al., "High Aspect Ratio Through-Wafer Interconnections for 3D-Microsystems" Delft University of Technology. IEEE 2003, pp. 634-637.
Laermer, F. et al., Challenges, Developments and Applications of Silicon Deep Reactive Ion Etching Microelectronics Engineering, vol. 67-68, Jun. 2003, pp. 349-35.
Tsang, C. et al. "CMOS-Compatible Through Silicon Vias for 3D Process Integration" Mater. Res. Soc. Symp. Proc. vol. 970, 2007.

*Primary Examiner* — David S Blum
(74) *Attorney, Agent, or Firm* — Sherry W. Schumm

(57) ABSTRACT

Electronic elements with very low resistance back-side coupling are provided by forming one or more narrow trenches or pipes, preferably dielectric lined, in front sides of substrates, filling the trenches or pipes with a conductor having a coefficient of expansion not too different from that of the substrate but of higher conductivity, forming an epitaxial SC layer over the front side of the substrate in Ohmic contact with the conductor the trenches or pipes, forming various semiconductor (SC) devices in the epi-layer, back grinding the substrate to expose bottoms of the conductor filled trenches or pipes, and providing a back-side conductor contacting the conductor in the trenches or pipes. For silicon SCs, tungsten is a suitable conductor for filling the trenches or pipes to minimize substrate stress. Series ON-resistance of the elements due to the substrate resistance is substantially reduced.

19 Claims, 9 Drawing Sheets

20

40

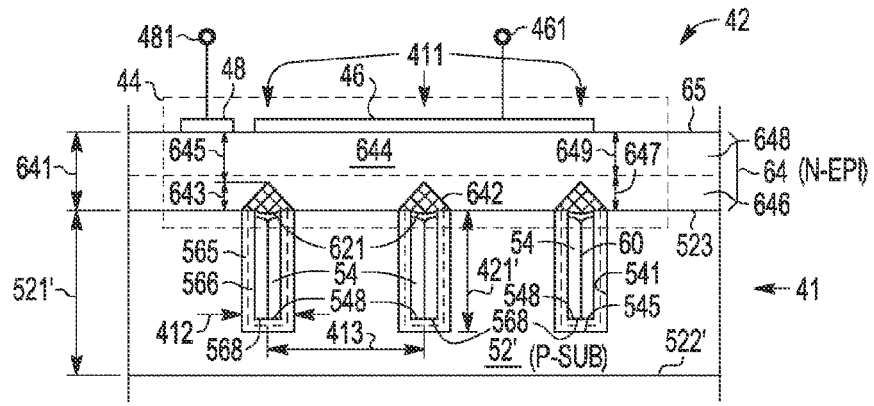
FIG. 15    115    315
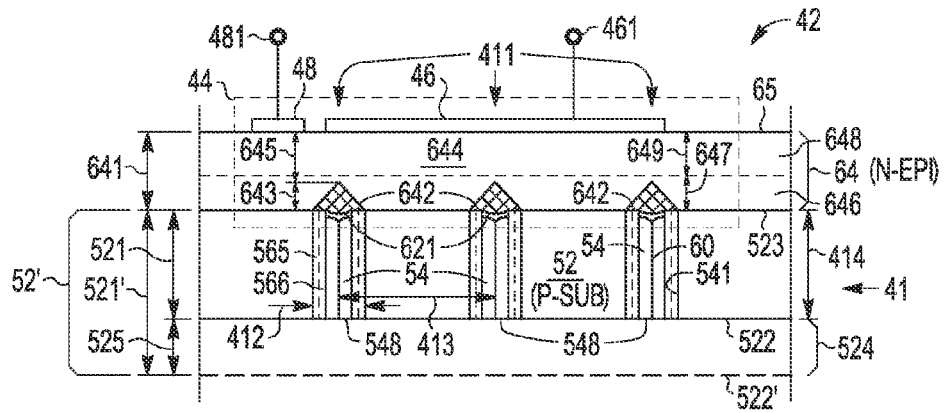
FIG. 16    116    316
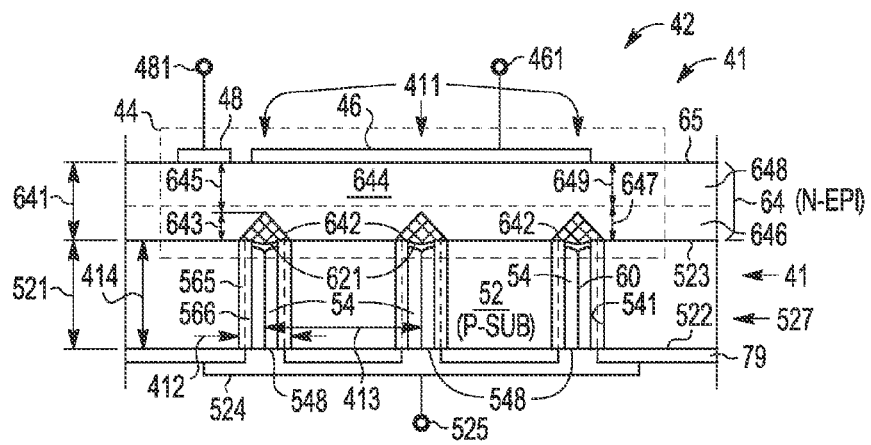
FIG. 17    117    317    40

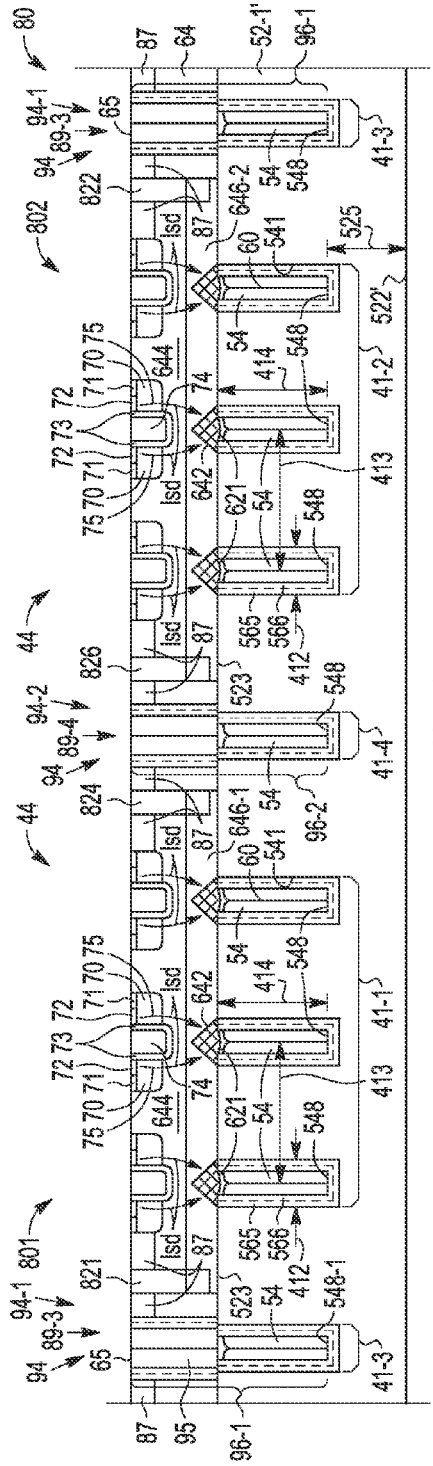
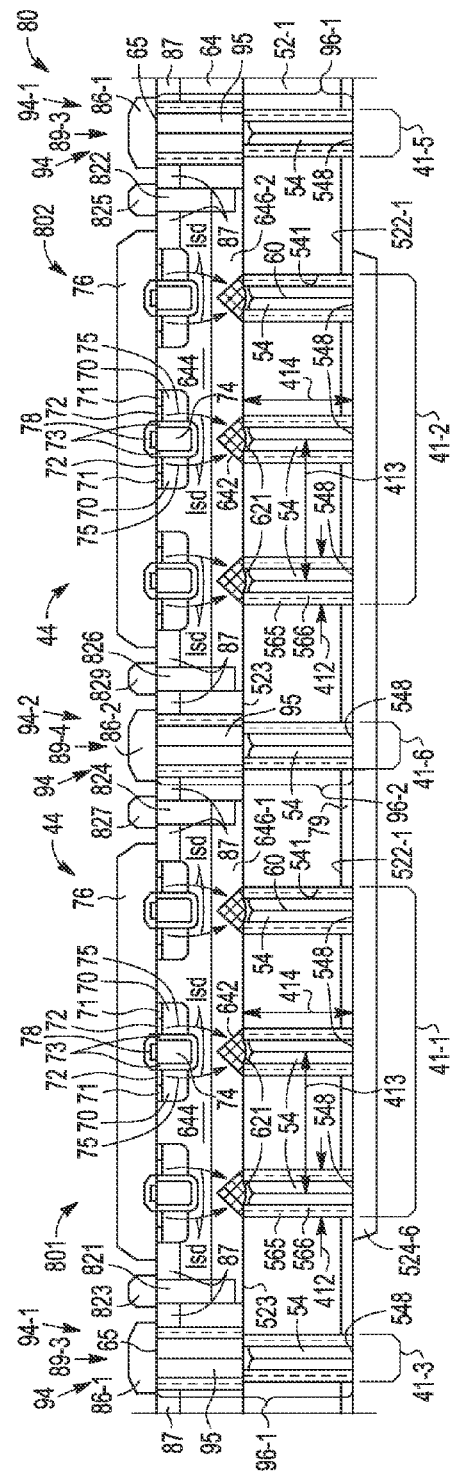

SEMICONDUCTOR DEVICES WITH LOW RESISTANCE BACK-SIDE COUPLING

RELATED APPLICATION

This application is a divisional of, U.S. patent application Ser. No. 12/564,307, now U.S. Pat. No. 8,021,926, filed on Sep. 22, 2009.

FIELD OF THE INVENTION

The present invention generally relates to semiconductor (SC) devices and integrated circuits (ICs) and, more particularly, structures and methods for devices and ICs with low resistance back-side coupling.

BACKGROUND OF THE INVENTION

It is well known to form semiconductor devices and/or ICs where the principal device current or other significant device current is carried through the semiconductor to the back side of the substrate on or in which the SC device or IC is formed. The device may be a stand-alone device such as a power device, or part of an integrated circuit (IC) formed in or on a common semiconductor or other substrate. Vertical channel field effect transistors (FETs) and vertical channel metal-oxide field effect transistors (MOSFETs) such as trench-FETs, trench-gate MOSFETs, U-channel MOSFETs (UMOS), V-type MOSFETs (VMOS), and T-type MOSFETS (TMOS) are non-limiting examples of devices in which the principal device current flows from an active device region near an upper device surface through the bulk of the semiconductor substrate to a backside of the device where it is extracted. In other configurations applicable to various small signal as well as power semiconductor devices, low resistance coupling to back-side contacts, conductors and/or interconnections may be used for a variety of purposes. The abbreviations MOS, MOSFET, VMOS, UMOS, TMOS and the like are intended to include devices whose dielectric layers may include materials other than oxides.

FIG. 1 is a simplified schematic cross-sectional view of generalized semiconductor (SC) element 20 in which principal current I flows through semiconductor substrate 22 to back-side 222 of device 20. The active portions (e.g., devices 21) of element 20 are formed within region 24 primarily in upper layer 23, often an epi-layer, near front surface 25. Devices 21 within region 24 may be any type of SC device. First principal contact 26 is generally made to the active portion of device(s) 21 in region 24 on upper surface 25. Terminal 261 is provided to contact 26. Control contact 28 is generally also made to the active device portion of device(s) 21 within region 24 on upper surface 25. Terminal 281 is provided to contact 28. Backside contact 224 is provided on back surface 222 of substrate 22 thereby forming a second principal contact to element 20. Terminal 225 is provided to contact 224. Resistance Ra represents the internal resistance of active device(s) 21 within region 24 and resistance Rs represents the resistance of substrate 22. Principal current I flows through resistances Ra and Rs when element 20 is in the ON state. Accordingly, neglecting contact, metal and wires resistances, the ON-resistance of element 20 is given substantially by Ron=Ra+Rs.

It has been found that a significant portion, sometimes a dominant portion, of the series ON-resistance Ron of element 20 is attributable to substrate resistance Rs. Various attempts have been made in the past to reduce Rs, as for example, thinning the substrate or etching depressions in the back side of the substrate and filling them with highly conductive metals such as copper. However, none of these prior art approaches to reducing Rs has proved completely satisfactory. For example: (i) it is often difficult to etch high aspect ratio AR (AR=depth/width) vias or trenches in thick wafers with the result that achievable vias or trenches occupy undesirably large amounts of chip area; and/or (ii) substantial thinning of the substrates to facilitate forming narrow or small area vias can make the semiconductor wafers or die on or in which the SC devices or ICs are being fabricated extremely fragile and difficult to handle in volume manufacturing without undue breakage loss; and/or (iii) use of plated copper vias or trenches in the wafer backside as has been attempted in the prior art can introduce stress in the wafer or die that can adversely affect device properties and stability. Accordingly, there is an ongoing need to provide more robust fabrication methods and structures for devices and ICs employing back-side coupling and contacts, especially those incorporating power devices, that can provide lower Rs while avoiding or minimizing the foregoing and other limitations of the prior art.

BRIEF DESCRIPTION OF THE DRAWINGS

The present invention will hereinafter be described in conjunction with the following drawing figures, wherein like numerals denote like elements, and wherein:

FIGS. 7-17 are simplified schematic cross-sectional views or slices of the generalized electronic elements of FIGS. 2-6 at different stages of manufacture, according to still further embodiments of the present invention and showing additional details;

FIGS. 24-26 are simplified schematic cross-sectional views analogous to those of FIGS. 21-23, but according to additional embodiments of the invention and at several stages of manufacture.

DETAILED DESCRIPTION OF THE INVENTION

Figure 1:
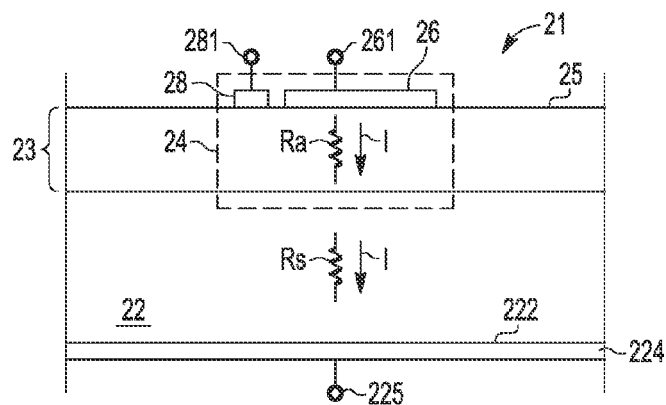
FIG. 1 is a simplified schematic cross-sectional view of a generalized electronic element in which principal current I flows from a device regions near a front surface through a semiconductor substrate to a back side of the SC die or wafer.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. The term "poly" stands for a polycrystalline semiconductor or other polycrystalline conductive material whether semiconductor or not. The term "semiconductor" is abbreviated as "SC." Similarly, polycrystalline silicon is abbreviated as Poly-Si. The abbreviation TSV stands for "Through Substrate Via" and the abbreviation BSV stands for "Backside Substrate Via.". The phrases "substantially" and/or substantial" mean largely but not necessarily wholly that which is specified such that any lack of completeness, perfection, containment and/or other described function, may be neglected. For example, and not intended to be limiting: (i) in the case of a conductor in a cavity, which conductor is intended to provide electrical and/or thermal continuity, that any voids or other unfilled portions of the "substantially" filled cavity are such as to not interrupt such continuity, (ii) in the case of a barrier layer intended to "substantially" prevent mixing or inter-diffusion of materials on either side of the barrier layer, that the amount of inter-diffusion or mixing, if any, is so small as to not have any significant adverse effect on the properties of such separated materials, and (iii) in the case of one or more devices "substantially" contained within a given region, that some portion(s) of the devices may extend into adjacent regions.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second" opposite conductivity type", wherein the first conductivity type may be either N or P type and the second opposite conductivity type is then either P or N type, and so forth. Further, for convenience of explanation and not intended to be limiting, various embodiments of the present invention are described herein for silicon semiconductors, but persons of skill in the art will understand the invention is not limited to silicon but applies to a wide variety of semiconductor materials. Non-limiting examples are other type IV semiconductor materials, as well as type III-V and II-VI semiconductor materials, organic semiconductor materials and combinations thereof, whether in bulk form or in layered form or in thin film form or semiconductor-on-insulator (SOI) form or combinations thereof. Such materials may be single-crystal or poly-crystalline or amorphous or combinations thereof.

Figure 2:
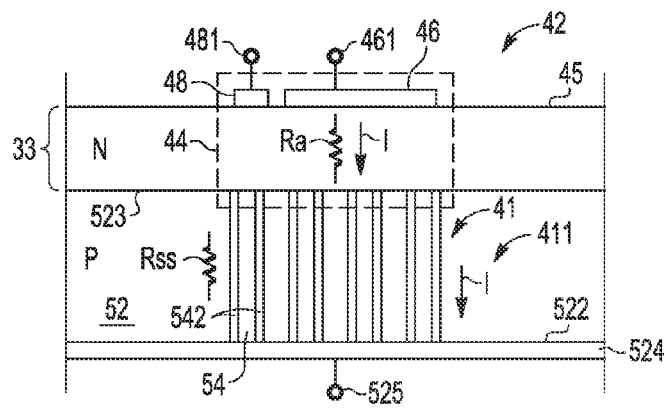
FIG. 2 is simplified schematic cross-sectional view of a generalized electronic element in which principal current I flows from a device regions near a front surface through a semiconductor substrate to a back side of the die or wafer, according to an embodiment of the present invention.

FIG. 2 is a simplified schematic cross-sectional view of generalized electronic element 40 in which principal current I flows through semiconductor substrate 52 to backside 522 of (e.g., SC die or wafer) substrate 52, according to an embodiment of the present invention. Active device 42 of element 40 is primarily formed within region 44 principally in upper layer 33, analogous to region 24 and layer 23 of FIG. 1. Any type of semiconductor device 42 may be formed within region 44. Element 40, by way of example and not intended to be limiting, employs P-type substrate 52 and overlying N-type layer 33. The choice of conductivity types for substrate 52 and layer 33 will depend upon the particular type of device 42 to be fabricated in region 44. First principal contact 46 is made to the appropriate current carrying portion of device 42 within region 44 via upper surface 45. Terminal 461 is provided to contact 46. Control contact 48 is made to the appropriate control portion of device 42 within region 44 via upper surface 45. Terminal 481 is provided to contact 48. Backside contact 524 on backside 522 of substrate 52 is coupled to conductor filled trenches 41 and forms a second principal current carrying contact to device 42 of element 40. Terminal 525 is provided to backside contact 524. Resistance Ra represents the internal resistance of the device portions within device region 44 and resistance Rss represents the resistance contributed by substrate 52. Principal current I flows through resistances Ra and Rss when device 42 of element 40 is ON. Accordingly, neglecting contact and wire resistances, the series ON-resistance of element 40 is given substantially by Ron=Ra+Rss. Resistance Rss of element 40 is reduced compared to resistance Rs of element 20 by providing in substrate 52, an array of pipes or trenches 411 filled with conductor 54 located beneath device region 44, wherein conductor filled trenches 41 are more conductive than comparable regions of substrate 52. Non-limiting examples of suitable materials for conductor 54 are metals, silicides, nitrides and other materials of higher conductivity than substrate 52. Conductor 54 in trenches or pipes 411 makes Ohmic electrical contact with back-side contact 524. In the embodiment shown in FIG. 2, element 40 includes dielectric liner 542 in trenches or pipes 411 that insulates conductor 54 within conductor filled trenches or pipes 41 from substrate 52. However, in other embodiments, dielectric liner 542 may be omitted or included in some of trenches or pipes 41 but not in others. Either arrangement is useful. The various embodiments described herein for trenches or pipes 41, conductor(s) 54, filling trenches 411 with conductor(s) 54 and the fabrication of layer 33 in which device region 44 can be formed, avoid or minimize the undesirable wafer stress, manufacturing fragility and other problems of the prior art. These choices are described more fully in connection with FIGS. 3-24

FIGS. 3-6 are plan views of a layout of substrate trenches or pipes 41, 411 useful for the devices of FIG. 2 as viewed looking toward backside 522 of substrate 52 of FIG. 2 before backside contact 524 is applied. The convention is adopted of using reference number 411 to refer collectively to such trenches and pipes when empty and reference number 41 to refer collectively to such trenches and pipes when filled with conductor 54. Trenches or pipes of particular plan view geometries are identified by a numerical suffix, as for example, trenches 411-3, 411-4, 411-5, 411-6 (collectively 411) in FIGS. 3-6 respectively.

Figure 3:
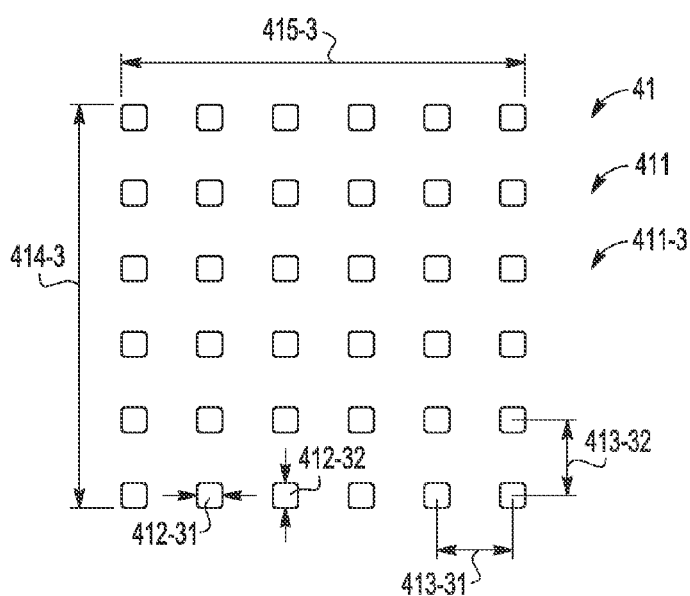
FIGS. 3-6 are plan views of a layout of substrate trenches or pipes useful for the elements of FIG. 2, as viewed looking toward the backside substrate surface of the elements of FIG. 2.
Figure 4:
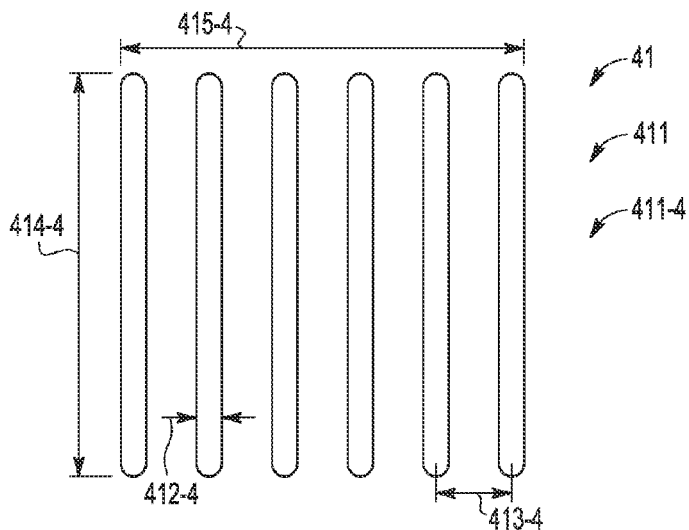
Figure 5:
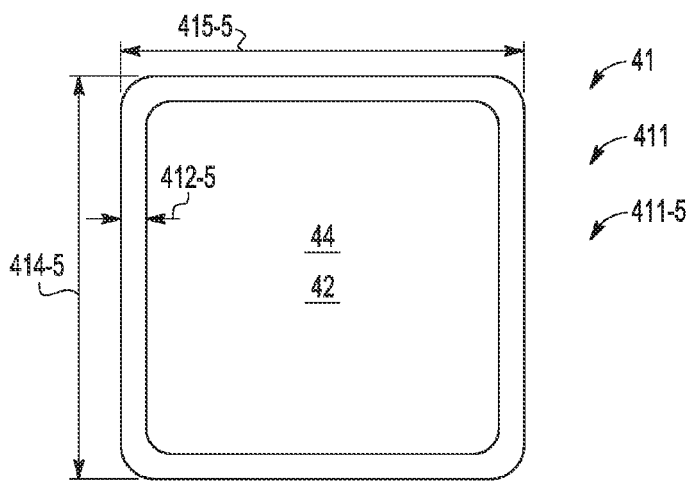
Figure 6:
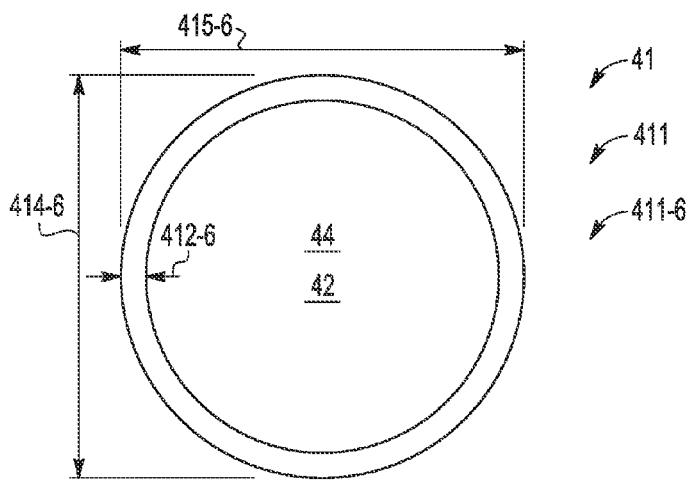

In FIG. 3 there is illustrated a cellular-like array of pipes 41, 411-3, in FIG. 4 there is illustrated a linear stripe-like array of trenches 41, 411-4 and in FIG. 5-6 there are illustrated one or more enclosing trenches 41, 411-5, 411-6. Enclosing trenches 411-5, 411-6 are illustrated as having a substantially rectangular or elliptical shape, but it should be understood that any annular or hollow two-dimensional plan view shape may be used. Reference numbers 411 is intended to refer to any or all of empty pipes 411-3, empty trenches 411-4 and empty enclosing trenches 411-5, 411-6, and reference number 41 is intended to refer to any or all of such pipes or trenches when filled with conductor 54. Any such arrangements and combinations thereof may be used in connection with element 40.

Individual pipes 411-3 of FIG. 3 are conveniently substantially circular or rectangular in plan view but other shapes may also be used, such as for example and not intended to be limiting, ellipses, triangles, rectangles, multisided polygons and various other shapes. Widths 412-31, 412-32 are usefully in the range of about 0.1 to 5 micrometers, more conveniently about 0.3 to 3 micrometers and preferable about 0.5 to 1 micrometers. Spacings 413-31, 413-32 are usefully about 1 to 10 times, more conveniently about 2 to 3 times and preferably about 2.5 times widths 412-31, 412-32. Height 414-3 and width 415-3 of the overall array of pipes 41 can be $10^1$ to $10^4$ or more times spacings 413-31, 413-32 but other dimensions are also useful. It is assumed in FIG. 3 and following that widths 412-31, 412-32 are the same and spacings 413-31, 413-32 of pipes 411-3 are the same, but this is merely for convenience of illustration and not intended to be limiting. It should be understood that widths 412-31 may be the same or different than widths 412-32, and that spacings 413-31 may be the same or different than spacings 413-32. In preferred embodiments, array height 414-3 and array width 415-3 are usually chosen so as to substantially match the lateral dimensions of overlying active device region 44, but larger or smaller values may also be used and they may be the same or different in magnitude.

Trenches 411-4 of FIG. 4 have widths 412-4 usefully in the range of about 0.1 to 5 micrometers wide, more conveniently about 0.3 to 3 micrometers wide and preferable about 0.5 to 1 micrometers wide and spacings 413-4 are usefully about 1 to 10 times, more conveniently about 2 to 3 times and preferably about 2.5 times widths 412-4. Height 414-4 and width 415-4 of trenches 411-4 can be $10^1$ to $10^4$ or more times spacing 413-4. In preferred embodiments, height 414-4 and width 415-4 are usually chosen so as to substantially match the lateral dimensions of overlying active device region 44, but larger or smaller values may also be used and they may be the same or different in magnitude.

Persons of skill in the art will understand that individual pipes 411-3 and trenches 411-4 may be placed beneath active device region 44 so as to be located along preferred paths for the components of principle device current I depending upon the particular design of the various portions of device(s) 42 within active device region 44. The layouts illustrated in FIGS. 3-4 (and 5-6) and the various dimensions noted above are merely examples of useful embodiments and not intended to be limiting. Larger or smaller dimensions and other shapes can also be used. It has been found that, when filled with preferred conductor 54 (e.g., tungsten), that 70%-80% of the area of, for example, a 200 mm diameter silicon wafer can be covered in plan view by such trenches or pipes without significant warping or increase in wafer breakage during manufacturing. This is a significant advance in the art.

Enclosing trenches 411-5 of FIG. 5 and 411-6 of FIG. 6 can have annular widths 412-5 and 412-6 generally similar to widths 412-31, 412-32, 412-4 already described and may be substantially rectangular in plan view shape as in FIG. 5 or elliptical or circular, as illustrated in FIG. 6 or may have any other annular or hollow two-dimensional shape. In preferred embodiments, overall height 414-5, 414-6 and width 415-5, 415-6 of enclosing trenches 411-5, 411-6 of FIGS. 5 and 6 are usually chosen so as to substantially enclose overlying active device region 44, but larger or smaller values may also be used. Enclosing trenches 411-5, 411-6 are particularly useful for forming isolation walls and/or tying rear surface conductors to front side contacts (see for example, FIGS. 18-26). As used herein, the term "enclosing" and the equivalent with respect to trenches 411-5, 411-6 and the like is intended to include both open and closed plan view shapes.

FIGS. 7-17 are simplified schematic cross-sectional views of generalized element 40 of FIGS. 2-6 at different stages of manufacture, according to further embodiments of the present invention and showing additional detail. Identification of particular semiconductor and/or dielectric and/or masking materials, conductivity types, crystal orientations, doping levels, and other properties, etc., are intended to illustrate preferred parameters and not to be limiting, since it is to be understood that many variations may also be made.

Figure 7:
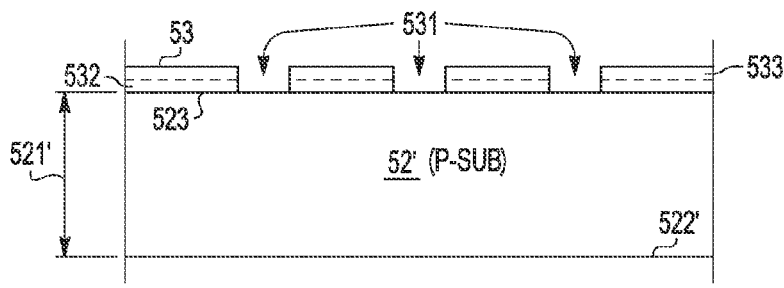

Referring now to manufacturing stage 107 illustrated in FIG. 7, P-type SC wafer substrate 52' (abbreviated as "P-SUB") is provided having thickness 521' between initial lower or backside surface 522' and initial upper or front surface 523. The convention is adopted of using primed reference numbers (e.g., 52', 521', 414', 522' etc.) to refer to regions, dimensions, and/or surfaces that have an initial configuration, value or location and unprimed reference numbers (e.g., 52, 521, 414, 522, etc.) to refer to the same or analogous regions, dimensions and/or surfaces after they have been modified during later manufacturing stages. For purposes of illustration and not intended to be limiting, substrate 52' is preferably of <100> oriented boron doped silicon, conveniently having resistivity in the range of ~2-20 Ohm-cm with thickness 521' of about 720 micrometers or more. But, different orientations, doping, resistivity and thicker and thinner substrates may also be used. Mask 53 is provided on initial upper or front surface 523 having openings 531 therein of a size, shape and location where it is desired to provide conductor filled pipes or trenches 41. While many materials are useful for mask 53, in a preferred embodiment, mask 53 is a double layer with first layer or portion 532 on surface 523 covered by second layer or portion 533. Layer 532 is preferably silicon oxide or other material compatible with surface 523 of SC substrate 52. Thicknesses of layer 532 in the range of about 40 to 80 nanometers are suitable, but thicker or thinner layers can also be used. Layer 533 is preferably of silicon nitride or other material resistant to reagents useful for etching SC substrate 52'. Thicknesses of layer 533 in the range of about 100 to 200 nanometers are useful and about 140 nanometers is preferred, but thicker or thinner layers may also be used. While silicon nitride is the preferred material for mask layer 533, silicon oxide and oxide-nitride combinations are non-limiting examples of other useful masking materials. The material(s) chosen for mask layer 53 should be able to adequately resist the reagents (including plasmas) used for etching trenches or pipes 411 into substrate 52' in manufacturing stage 108. Openings 531 are provided in first mask 53 using any convenient technique, as for example and not intended to be limiting, photo-resist application and patterning followed by reactive ion etching of openings 531 through mask 53 in locations corresponding to the desired size, shape and locations of trenches or pipes 411. While only three openings 531 are illustrated in FIG. 7 and subsequent figures, persons of skill in the art will understand that fewer or more openings and trenches or pipes 411 may be provided so as to yield in later manufacturing stages the desired array of conductor filled trenches or pipes 41. Structure 307 results.

Figure 8:
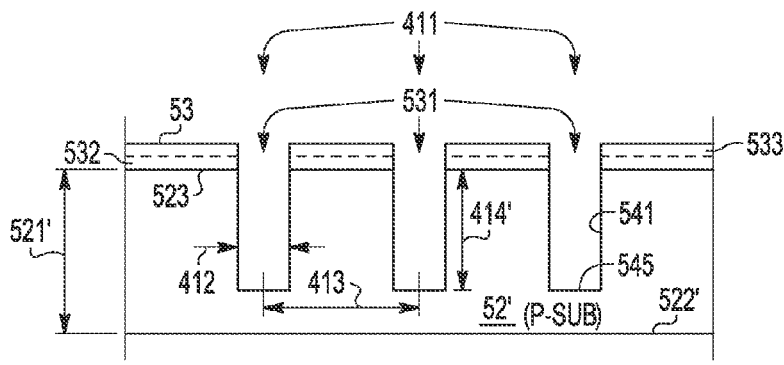

Referring now to manufacturing stage 108 shown in FIG. 8, pipes or trenches 411 are formed in substrate 52 through openings 531 to depths 414'. Depth 414' is usefully in the range of about 25 to 250 micrometers, more conveniently about 25 to 150 micrometers and preferably about 25 to 75 micrometers, but larger or smaller values may also be used, depending upon the desired thickness of the finished device die. Etching is preferably performed by deep reactive ion etching (DRIE) using the Bosch process. The Bosch process for DRIE is well known and described for example in "Challenges, Developments and Applications of Silicon Deep Reactive Ion Etching" by F Laermer and A. Urban in *Microelectronics Engineering*, Vol. 67-68, June 2003, pages 349-358 and in the references cited therein and in other available publications. Commercial DRIE tools are available from Surface Technology Systems, plc of Imperial Park, Newport, NP108UJ, United Kingdom, from LAM Research Corporation, Fremont, Calif. 94538 and from other companies. Pipes or trenches 411 have widths 412, separations 413, depth 414', sidewalls 541 and bottoms 545. Structure 308 results.

Figure 9:
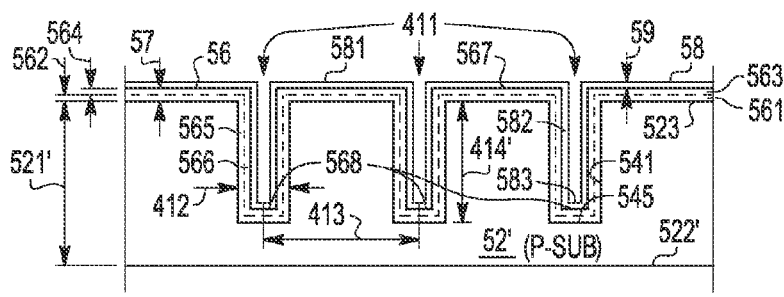

Referring now to manufacturing stage 109 of FIG. 9, empty trenches or pipes 411 formed in manufacturing stage 108 of FIG. 8 are conformally lined with substantially insulating layer 56 of thickness 57. In a preferred embodiment, layer 56 is further covered by seed layer 58 of thickness 59. Insulating layer 56 may be a substantially homogenous layer in some embodiments, and in other embodiments a multi-layer structure. In a preferred embodiment, layer 56 is desirably a double layer with first insulating layer 561 of thickness 562 on surface 523, sidewalls 541 and bottoms 545, with overlying second barrier layer 563 of thickness 564. Portions 565 of first layer 561 coat sidewalls 541 of trenches 411. Portions 566 of second layer 563 overlie portions 565 of first layer 561 on sidewalls 541 of trenches 411. Seed layer 58 desirably overlies second layer 563 but may be omitted in other embodiments. First layer 561 is preferably an insulator such as, for example and not intended to be limiting, silicon dioxide with thickness 562 desirably in the range of about 20 to 200 nanometers with about 40 to 100 nanometers being preferred, but thicker or thinner layers and other insulating materials may also be used. The principal function of first layer 561 is to electrically insulate conductor 54 that will later be placed in trenches 411 from substrate 52'. Second layer 563 is preferably a diffusion barrier layer such as, for example and not intended to be limiting, titanium nitride (TiN), silicon nitride ($Si_3N_4$) and/or combinations thereof, but other materials may also be used. TiN is preferred. Thickness 564 is desirably in the range of about 20 to 80 nanometers with about 40 to 60 nanometers being preferred, but thicker or thinner layers may also be used. The principal function of second layer 563 is to protect underlying dielectric layer 561 from undesirable contamination from overlying materials such as seed layer 58 and/or conductor 54 that will later be placed in trenches 411 in substrate 52'. Seed layer 58 is formed over second layer 563. The principal purpose of seed layer 58 is to provide a base for selective deposition of conductor 54 that ultimately fills pipes or trenches 41. In a preferred embodiment, seed layer 58 is chosen of a material on which conductor 54 will selectively deposit while not significantly depositing on surfaces not covered by seed layer 58. It has been found that when it is desired to use tungsten (W) or tungsten containing compounds (e.g., WSi) for conductor 54, that polysilicon is a suitable seed material and is preferred. However other materials may also be used. Thickness 59 of seed layer 58 is usefully in the range of about 10 to 30 nanometers and preferable in the range of about 15 to 20 nanometers, but thinner or thicker layers may also be used. Chemical vapor deposition (CVD) is a non-limiting example of a suitable deposition technique for forming layers 56, 561, 563, 58, but other substantially conformal deposition techniques may also be used. Structure 309 results. Referring now to manufacturing stage 110 of FIG. 10, structure 309 of FIG. 9 is conveniently subjected to anisotropic etching of seed layer 58 to remove portions 581 (see FIG. 9) of layer 58 lying on upper surface 567 of layer 56, leaving behind portions 582 of seed layer 58 on portions 566 of layer 56 on interior sidewalls 541 of trenches 411. Methods for anisotropic etching of, for example, polysilicon containing seed materials are well known in the art. Reactive-ion etching (RIE) and chemical-mechanical polishing (CMP) are well known examples of selective material removal techniques suitable for use with layer 58. When RIE is used, portions 583 of layer 58 in the bottom of trenches 411 may also be removed to expose portions 568 of layer 56 on bottoms 545 of trenches 411, but this is not important and other removal techniques, (e.g., CMP) which do not affect the trench bottoms may also be used. RIE is preferred. Structure 310 results.

Figure 10:
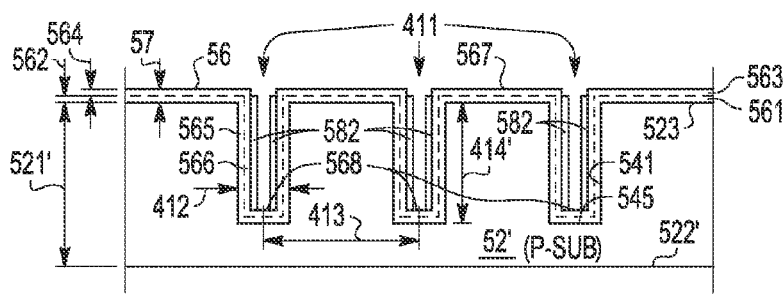
Figure 11:
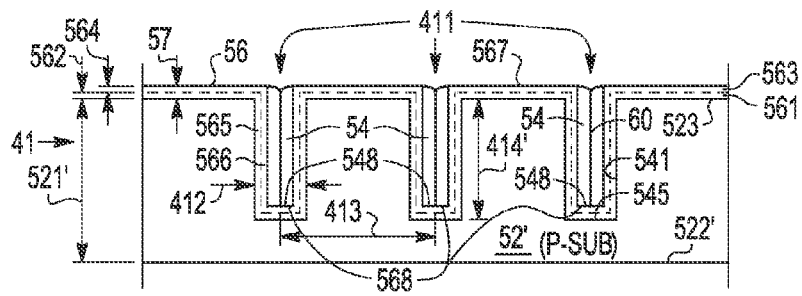

Referring now to manufacturing stage 111 of FIG. 11, structure 310 comprising trenches or pipes 411 lined with insulating barrier layer 56 and localized portion 582 of seed layer 58 formed in manufacturing stages 109-110 of FIG. 9-10 is filled with conductor 54. For silicon or silicon containing substrates 52', tungsten is the preferred material for conductor 54, but other highly thermally and electrically conductive materials can also be used. More generally, the ratio of thermal coefficient of expansion (TCE) of conductor 54 ($TCE_{54}$) to the TCE of substrate 52' ($TCE_{52}$), that is, ($TCE_{54}$)/($TCE_{52}$) is desirably less than or equal about 3, more conveniently less than or equal about 2 and preferably less than or equal about 1.5. For example, Si has a thermal expansion coefficient of 3.0E-6 per ° C., and W, Mo, Ta, Ti, $WSi_2$, $MoSi_2$, $TaSi_2$ and $TiSi_2$ have coefficients of 4.5, 5.0, 6.5, 8.5, 6.2, 8.2, 8.8 and 10.5E-6 per ° C., respectively. Thus, W followed by Mo and $WSi_2$ are useful candidates to obtain the most stable and stress free structures of element 40 with substrates 52' of silicon because they have TCEs that most closely match that of silicon. With substrates 52' of other materials, then preferred conductors 54 for filling trenches 411 should be among those that most closely matched the TCE of such other substrate material, for example in preferred embodiments, within the guidelines provided above for the ratio ($TCE_{54}$)/($TCE_{52}$).

Chemical vapor deposition (CVD) using tungsten fluoride as a tungsten source in hydrogen is preferred. CVD is well known in the scientific community and industrial equipment is available on the market, for example the ERA-100 reactor provided by ULVAC, Inc of Chigasaki, Kanagawa, Japan 253-8543. Since the process is a reaction occurring at the molecular level, deposition is catalyzed by the presence of portions 582 of seed layer 58 (e.g., comprising silicon) on portions 566 of layer 56 on trenches side-walls 541. Exposed surface 567 of layer 56 does not have any portion of seed layer 58 left thereon, so there is no seed to initiate the reaction there and the deposition is selective to the interior of trenches 411. It does not matter whether seed layer 58 is present on portions 568 of layer 56 in the bottom of trenches 411, since lateral growth of conductor 54 during trench filling covers portions 568. Further, since in later manufacturing stages, wafer backside 522' will be etched or ground to expose conductor 54 in trenches 411, the absence of any seed layer on trench bottoms 586 is not significant. In order to achieve good filling in trenches 411 with high aspect ratio AR (e.g., AR≧50, more preferably AR≧100), the reactor pressure is in desirably in the range of about ≦100-0.1 milli-Torr, preferably about ≦10 milli-Torr, and the temperature about ≧400° Celsius. It is desirable in some embodiments to stop tungsten deposition when trenches 411 are substantially full so as to avoid a subsequent planarization step, but in other embodiments, such as is shown here for example, deposition may continue until conductor 54 is substantially even with surface 576. Other selective deposition processes for forming conductor 54 may also be used. Portion 582 of seed layer 58 becomes incorporated into conductor 54 as conductor 54 grows within trenches 411. Central seam 60 may generally be seen in conductor 54 in filled trenches or pipes 41 where depositing conductor 54 grows substantially closed. Seam 60 generally has no significant influence on the final result, provided that there is not a significant gap at seam 60 so as to adversely affect electrical and/or thermal conductivity of filled trenches 41. Structure 311 results.

Figure 12:
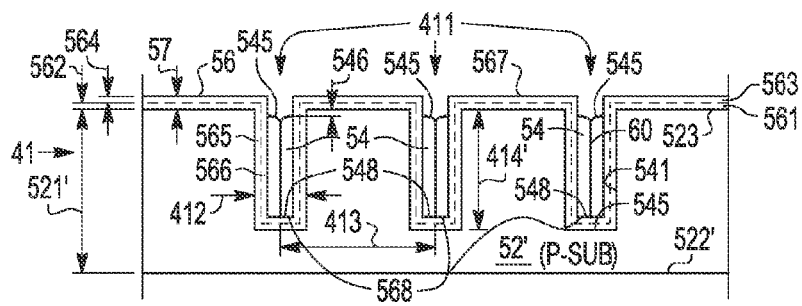

Referring now to manufacturing stage 112 of FIG. 12, in a preferred embodiment structure 311 comprising trenches or pipes 411 filled with conductor 54, is subjected to a brief etch of conductor 54 resulting in upper surface 545 of conductor 54 in trenches 411 being slightly recessed by distance 546 below surface 523 of substrate 52'. Manufacturing stage 112 is preferred but may be omitted in other embodiments. Distance 546 is usefully in the range of about 0.01 to 0.5 micrometers, more conveniently about 0.05 to 0.25 micrometers, and preferably about 0.10 to 0.15 micrometers, but other values may also be used. Stated another way, it is desirable that distance 546 and barrier material portion 621 formed in manufacturing stages 113-114 be such that diffusion of metal or other conductor 54 from within pipes or trenches 41 into overlying SC layer 64 during formation of layer 64 in manufacturing stage 115 and any subsequent heat treatment be substantially precluded. This minimized formation of dislocations in SC layer 64 near the growth interface over conductor filled vias 41. Reactive ion etching (RIE) in $CF_4$ or $CF_4/O_2$ is a preferred method for such tungsten etching, but other etching techniques may also be used depending upon the choice of conductor 54. Structure 312 results.

Figure 13:
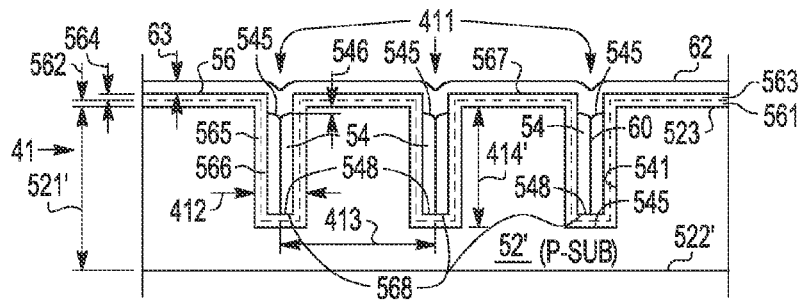
Figure 14:
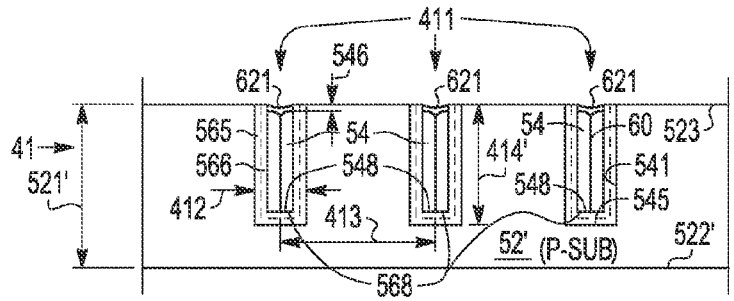

Referring now to manufacturing stage 113 of FIG. 13, in a preferred embodiment, structure 312 is covered by barrier layer 62 of thickness 63. Barrier layer 62 also forms over surface 545 of conductor 54 in trenches or pipes 411. Thickness 63 is usefully about equal to the depth of the recess above surface 545 of conductor 54 formed in manufacturing stage 112, and in a preferred embodiment is about 0.1 to 0.2 micrometers, but thicker and thinner layers may also be used. The purpose of barrier layer 62 is to preclude significant contamination of the semiconductor material that will be formed above conductor 54 by the material of conductor 54 and/or, for example, the formation of inter-metallic semiconductor-metal compounds such as WSi when conductor 54 is of tungsten and a silicon SC layer is formed there-over in later manufacturing stages. Titanium nitride is a preferred material for barrier layer 62, but other electrically conductive diffusion or contamination barrier materials may also be used. Structure 313 results. Referring now to manufacturing stage 114 of FIG. 14, structure 313 is planarized to remove those portions of layers 56 and 62 overlying surface 523 of substrate 52'. In manufacturing stage 114 of FIG. 14, chemical-mechanical polishing (CMP) combined with a brief oxide etch is a preferred and well known method for removing the portions of layers 56, 62 above surface 523 thereby providing planarized structure 314, but other planarization techniques may also be used. In a preferred embodiment, portions 621 of barrier layer 62 are left in place above surface 545 of conductor 54 in trenches or pipes 411 to preclude undesirable doping from conductor 54 of epitaxial semiconductor layer 64 to be formed over surface 523 and conductor 54 in subsequent manufacturing stage 115 and/or formation of, for example, of a silicide (e.g., WSi) during such epitaxial growth. Portions 621 of layer 62 are desirably sufficiently electrically conductive so as to not add significant resistance between semiconductor layer 64 to be formed in manufacturing stage 115 and underlying conductor 54. Structure 314 results.

In an alternate embodiment of manufacturing stages 113 and 114, layer 563 (e.g., TiN) is removed by any convenient technique, as for example and not intended to be limiting, etching in hot phosphoric acid and barrier layer 62 (e.g., of TiN) of thickness 63 of about 0.15 micrometers then deposited on insulating (e.g., silicon oxide) first layer 561. The resulting structure is then planarized using, for example, a CMP process to remove the portion of barrier layer 62 and some or all of first insulating layer 561 above surface 523 and leave portion 621 of barrier (e.g., TiN) layer 62 capping conductor (e.g., tungsten) 54 in trenches or pipes 411. A brief wet etch may be used to remove any residual portions of first layer 561 on surface 523. As noted above, the purpose of portion 621 over conductor 54 in trenches or pipes 411 is to act as a barrier between conductor 54 and semiconductor (e.g., silicon) layer 64 that will be deposited in manufacturing stage 115 of FIG. 15, and avoid undesirable doping of SC layer 64 and/or formation of, for example a silicide (e.g., WSi) during growth of layer 64. Barrier layer portion 621 (e.g., of TiN) provides a good Ohmic contact between conductor 54 (e.g., tungsten) and subsequent semiconductor (e.g., silicon epi) layer 64. Any remaining portions of insulating first layer 561 above surface 523 can be removed by a standard wet etch. Structure 314 results.

Referring now to manufacturing stage 115 of FIG. 15, structure 314 is covered by semiconductor layer 64 of thickness 641. Semiconductor layer 64 is analogous to region or layer 33 of FIG. 3 and is desirably formed as an epitaxial layer so as to provide regions 644 of high quality substantially single crystal semiconductor material within device region 44 in which the desired transistor(s) or other active device(s) 42 may be substantially formed. Epitaxial growth can be achieved by many techniques. Non-limiting examples are ultra high vacuum chemical vapor deposition (UHV-CVD) at low temperature (e.g., around 550° C.), and/or low pressure chemical vapor deposition (LP-CVD) at higher temperature (e.g., around 900° C.) and by other means known in the art. During formation of layer 64, polycrystalline regions 642 initially form above filled trenches 41 due to the polycrystalline or amorphous nature of underlying material 54, 56, 62 in filled trenches 41. However, the single crystal regions forming epitaxially on surface 523 of substrate 52' on either side of filled trenches 41 grow horizontally as they grow vertically, thereby closing off poly regions 642 substantially at height 643. Depending upon the type of transistor(s) or other active device(s) 42 intended to be fabricated in device region 44, thickness 641 is adjusted in various embodiments to provide region 644 of thickness 645 of high quality epitaxial semiconductor material above and/or between poly regions 642 adequate for fabrication of the desired transistor(s) or other active device(s) 42 in region(s) 44. In these and still other embodiments, layer 64 may be formed in several stages with or without intermediate doping steps so that lower portion 646 of layer 64 is more heavily doped, for example and not intended to be limiting, to: (i) act as a buried layer to improve the performance of certain types of device(s) intended to be formed in device region 44 and/or (ii) improve Ohmic contact to portion 621 of barrier layer 62 above upper surface 545 (see FIG. 14) of conductor 54 and thus to upper surface 545 of conductor filled pipes or trenches 41. Examples of such embodiment are provided later.

In an alternate embodiment, to facilitate region 644 of epi layer 64 being high quality single crystal, it is desirably that thickness 647 of lower portion 646 be in the range of about 50 to 200 nanometers, more conveniently about 75 to 150 nanometers and preferably greater than or equal about 100 percent of width 412 of trenches or pipes 411. At the end of epitaxial growth, a heat treatment is desirably provided in the epi reactor to anneal and reduce the crystal defects. High temperature, e.g., around 1150° C. or more for approximately half a minute to several minutes is desirably provided in a hydrogen environment for such annealing. Another method to reduce the defects is to perform an ion implant of, for example, arsenic or antimony into lower portion 646 of epi layer 64 at an energy intended to deposit the implanted ions in a buried layer (BL) region formed in and/or above portion 646. The dose of the ions is desirably high enough (e.g., ~1E15 to 1E16 $cm^{-2}$) to locally amorphize the epi layer, including poly regions 621 above metal filled trenches or pipes 41. A thermal treatment is then performed, for example in a rapid thermal annealing (RTA) reactor, to recrystallize the epi layer. Temperatures around 1150° C. or higher for approximately half a minute to several minutes in a hydrogen environment is useful for such annealing. The recrystallization propagates from surface 523 of semiconductor substrate 52' as the seed, and grows laterally to cover regions 621 above metal filled trenches or pipes 41. Either arrangement is useful.

In a still further embodiment, epi-layer 64 may be formed in two stages, with portion 646 being formed as a first epi layer and portion 648 being formed as a second epi layer, with or without an intermediate doping step for portion 646. In general portion 648 is desirably of the same conductivity type as portion 646, but in other embodiments if a PN junction is desired as a part of or underlying active device region 44 in or adjacent portion 644, the opposite conductivity type SC material may be used for portion 646 or 648. Together, portions 646, 648 provide layer 64 analogous to layer 33 of FIG. 3 comprising all or a portion of device region 44. The conductivity type, doping and thickness 649 of portion 648 are chosen, for example, to provide the desired breakdown voltage BVdss of, for example, a power device subsequently formed in device region 44. Any of the foregoing embodiments may be used.

Whatever type of transistor and active or passive devices 42 are desired in device region 44, they are preferably formed in device region 44 in a conventional manner while substrate 52' is still in an un-thinned state, preferably as a part of manufacturing stage 115 following formation of SC layer 64. In this way, manufacturing robustness is preserved during such operations, many of which occur at high temperatures. Some or all of contacts 46 and 48 and terminals 461, 481 may also added in the conventional manner at this time to make connection to the transistors or other active and/or passive devices 42 formed in device region 44. In alternative embodiments, some connections or terminals may be added later. Structure 315 of FIG. 15 results. It will be noted that substantially all high temperature operations and most masking operations have been completed prior to the wafer thinning operation to be performed in subsequent manufacturing stage 116. In this way mechanical robustness of substrate 52' and element 40 is preserved through the most difficult part of the manufacturing process and breakage loss due to thin wafer fragility is substantially avoided while at the same time minimizing wafer distortion and stress associated with prior art techniques. This is a significant improvement in the art.

Referring now to manufacturing stage 116 of FIG. 16, substrate 52' is subject to a back-side thinning operation in which portion 524 of thickness 525 of original thickness 521' of initial substrate 52' is removed from initial backside or lower surface 522' so as to expose thinned backside 522 and portions 548 of conductors 54 in the bottom of pipes or trenches 411 that remain within thinned substrate 52. Filled trenches or pipes 41 have depth 414 that is less than initial depth 414' by about the thickness of the portion of insulating and barrier layer 56 that was formed in the bottoms of initial trenches or pipes 411. Structure 316 results. Other than providing any needed back side contacts or interconnections and other back-end operations (e.g., singulation, encapsulation etc.), element 40 is substantially finished. Referring now to manufacturing stage 117 of FIG. 1. Backside contact and/or interconnection 524 is applied over newly exposed rear or backside surface 522 so as to make Ohmic contact to exposed surfaces 548 of conductor 54 in pipes or trenches 411. Backside contact or interconnection 524 may be applied directly over newly exposed backside 522 of substrate 52 or dielectric layer 79 may be provide beneath contact or conductor 524 laterally outside of filled trenches 41 to electrically isolate conductor 524 from substrate 52. Either arrangement is useful. In this manner, conductor filled vias 41 are completed and connected as needed for the desired device and/or circuit application. Ti, Au, W, Ag, Cu and combinations thereof as well as various other elements and alloys and compounds are non-limiting examples of material suitable for backside conductor or contact 524. TiWCu is preferred. Structure 317 results. The structure of element 40 comprising devices 42 illustrated in FIG. 2 is thereby obtained.

FIGS. 7-17 show three metal-filled trenches or pipes 41 rather than four as shown in FIG. 2. This is to permit greater detail to be included in FIGS. 7-17 and avoid unduly cluttering the drawing. Any number n of conductor filled trenches 41 may be provided. In general, principal current I flowing from device portion 44 into substrate 52 will substantially divide among the various conductor filled trenches or pipes 41 because of their lower resistance relative to parallel portions 527 of substrate 52. Thus, approximately I/n of total current I (where n is the number of pipes or trenches 41) will flow through each of the n trenches or pipes 41 whose individual resistance is n*Rss, where Rss is the collective resistance of the n parallel metal filled trenches or pipes 41. The use of metal filled trenches 41 can significantly lower the total ON resistance Ron=Ra+Rss (see FIG. 2) compared to the prior art ON resistance Ron=Ra+Rs (see FIG. 1). The intrinsic resistance Ra is a strong function of the desired breakdown voltage, BVdss. For example, for a 20 volt rated device, the prior art specific resistance Ra is typically about 5 milli-Ohm*$mm^2$. The substrate specific resistance Rs of such a device in a standard 8 mil (~200 micrometer) thick wafer is about 5.5 milli-Ohm*$mm^2$, so that Ron is about 5+5.5~10.5 milli-Ohm*$mm^2$, with the substrate resistance Rs accounting for about 52% of the total resistance. For a device of the type shown in FIG. 2 having an equivalent breakdown voltage and the same intrinsic specific resistance Ra and formed in a thinned 3 mil (~76 micrometers) substrate, the substrate resistance Rss contributes only about 0.1 milli-Ohm*$mm^2$. The total specific resistance Ron is then about 5+0.1~5.1 milli-Ohm*$mm^2$, less than half the total resistance of an equivalent prior art device and of which the substrate resistance Rss is now only about 2%. Stated another way, the effective substrate resistance has been reduced by about a factor of 50 compared to an equivalent prior art device by virtue of the metal filled vias 41 placed underneath the device and the substrate thinning that can be accomplished at or near the end of the manufacturing so as to avoid the fragility problems associated with prior art manufacturing methods. This is a significant and much desired improvement. It will also be noted that conductor filled trenches 41 provide low resistance Ohmic back-side coupling even though a PN junction may exist between substrate 52 and epi-layer 64 which might otherwise block such through-substrate current.

Figure 18:
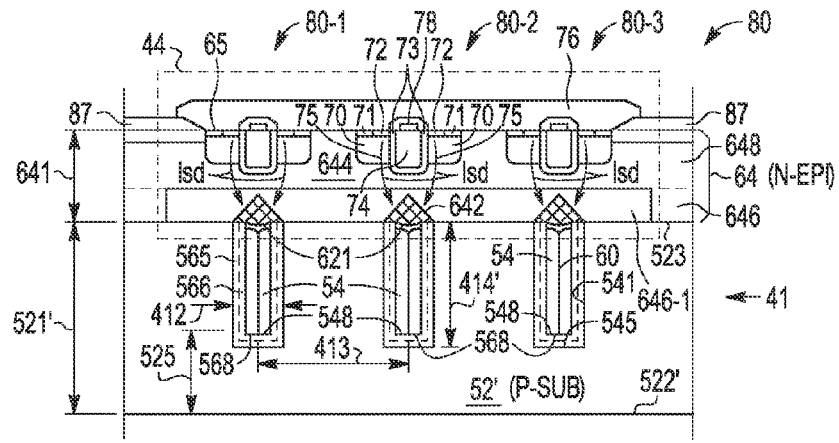
FIGS. 18-20 are simplified schematic cross-sectional views of the electronic elements of FIGS. 2-17 at different stages of manufacture of, by way of example a vertical channel MOSFET, according to yet further embodiments of the present invention and showing additional details.
Figure 19:
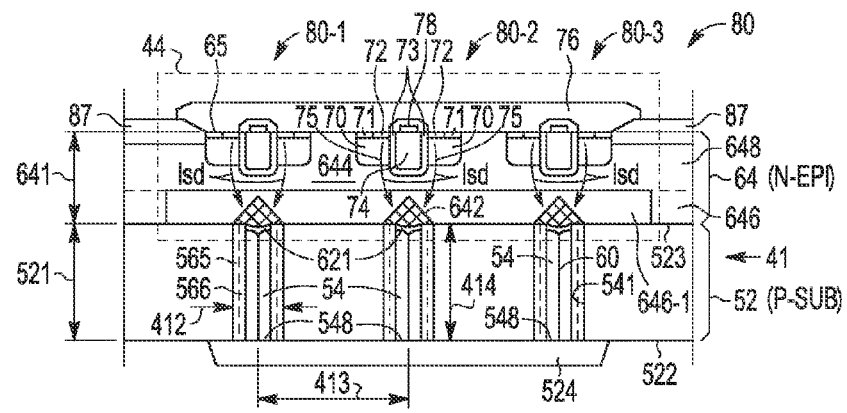
Figure 20:
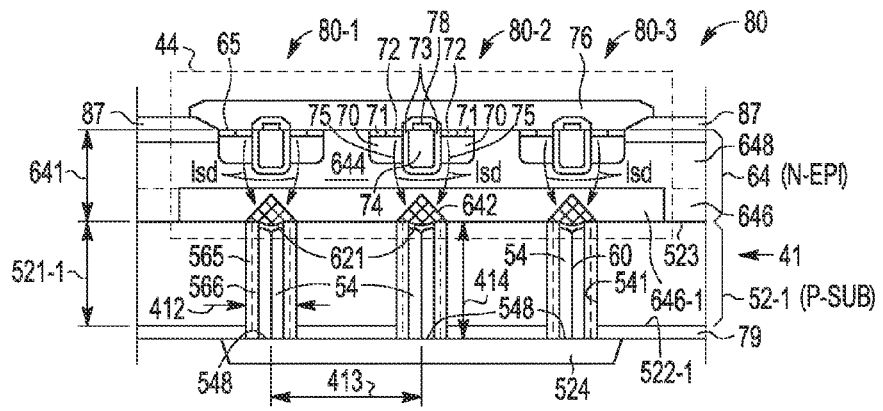

FIGS. 18-20 are simplified schematic cross-sectional views of electronic element 40 of FIGS. 2-17 at different stages of manufacture of, by way of example, vertical channel MOSFET 80, according to yet further embodiments of the present invention and showing additional details. MOSFET 80 comprises by way of example, three substantially identical device regions 80-1, 80-2, 80-3 collectively referred to as device 80. The various elements and regions identified in connection with device region 80-2 are representative of device regions 80-1 and 90-3 as well. Manufacturing stage 118 of FIG. 18 is generally analogous to manufacturing stage 115 of FIG. 15, but with a detailed example of a particular device type shown in region 44. Structure 318 of FIG. 18 illustrates partially completed vertical channel MOSFET 80 in device region 44. Vertical channel MOSFET 80 is intended by way of example and not limitation. Vertical channel MOSFET 80 comprises, for example, P type regions 70 with P+ contact regions 71 and N+ source regions 72 therein. Gate 74 is separated from P type region 70 and source regions 71 by gate dielectric 73. Gate 74 has gate contact 78. Source 72 has source and body contact 76 which acts as one of the principal current carrying contacts of device 80. Surface dielectric isolation regions 87 are provided in the usual manner. Structure 318 results.

Referring now to manufacturing stage 119 of FIG. 19, structure 318 is subjected to backside thinning operations such as has been described in connection with manufacturing stage 116 of FIG. 16, to remove excess substrate material, thereby exposing new rear surface 522 of thinned substrate 52. In manufacturing stage 119, backside conductor or contact 524 is desirably provided making Ohmic contact to lower surfaces 548 of conductor 54 in trenches 411. Structure 319 results. In an alternate embodiment, illustrated in manufacturing stage 120 of FIG. 20, prior to applying backside contact 524, newly exposed rear face 522 of substrate 52 of FIG. 19 is briefly etched so that newly exposed lower surface 522-1 is slightly recessed. Lower surfaces 548 of conductor 54 in trenches 411 protrude slightly from newly exposed surface 522-1. Dielectric layer 79 is applied and the structure re-planarized so that lower surfaces 548 of conductor 54 in trenches 411 are once again exposed. Then backside conductor 524 is applied. In this manner backside conductor 524 is in Ohmic contact with conductor filled trenches 41 via lower surfaces 548 thereof but electrically isolated from substrate 52-1. Any convenient insulating material may be used for layer 79. Polyimide or other organic dielectric is preferred but other dielectrics can also be used. Organic dielectrics can be easily applied by a spin-on process and readily planarized to expose surfaces 548 of conductor 54 in trenches 411. Such organic dielectrics have the further advantage as to not require high temperature operations. The thickness of insulating layer 79 should be sufficient to electrically withstand whatever electrical potential may be applied between conductor 524 and substrate 52-1. Structure 320 results. When referred to generally, newly exposed backside 522 is intended to include backside 522-1 of FIG. 20.

When gate 74 of device 80 of FIG. 20 is appropriately biased, channel 75 forms in P type region 70 extending from source region 72 to underlying portion 644 (if any) of N− EPI region 64 and buried layer 646-1 which is in contact with portions 641 of conductor 54 in trenches 41. Source-drain current Isd flows through channels 75 between source 72 and drain region 644/646-1, whence it is extracted by conductors 54 of filled trenches 41 and carried to backside contact or conductor 524 which, in this implementation, forms the second principal contact to device 80. Other than further standard back-end operations (e.g., singulation, die mounting, encapsulation, etc.) element 40 comprising device 80 illustrated in structure 320 of FIG. 20 is substantially finished. As has been previously explained in connection with FIG. 17, substantially all high temperature operations and most masking operations have been completed prior to the wafer thinning operation performed in manufacturing stage 119. In this way mechanical robustness of substrate 52' and device 80 is preserved through the most difficult part of the manufacturing process and breakage loss due to thin wafer fragility is substantially avoided while at the same time minimizing wafer distortion and strain associated with prior art techniques. This is a significant improvement in the art.

Figure 21:
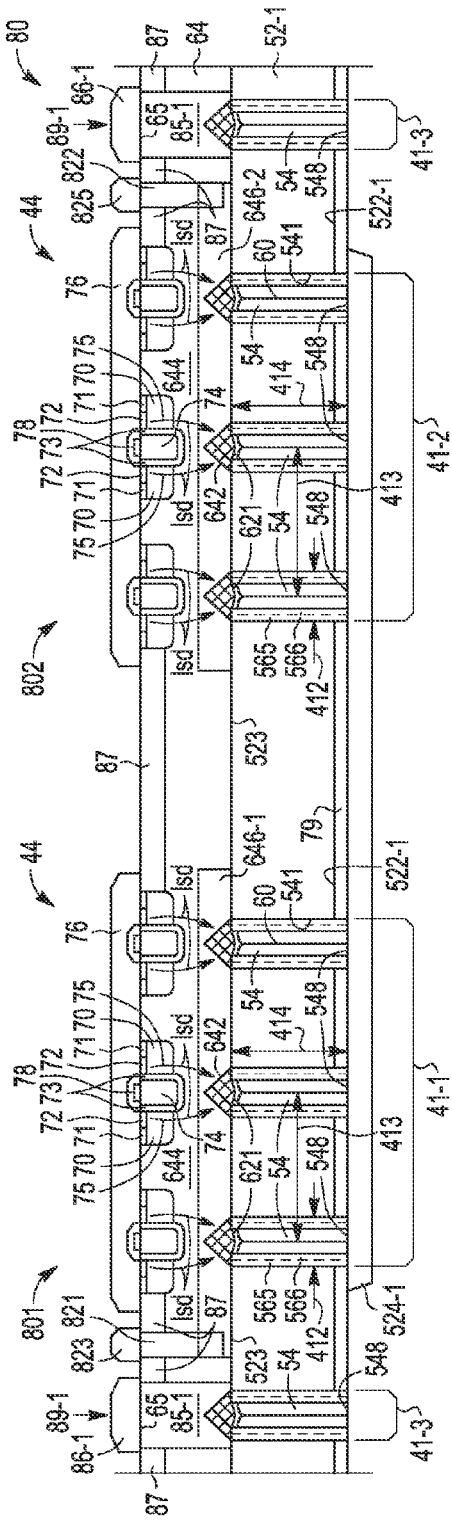
FIGS. 21-23 are simplified schematic cross-sectional views of the electronic elements of FIGS. 2-23 according to yet still further embodiments of the present invention and illustrating how the structures and methods described herein may be used to advantage to obtain various other device and circuit configurations.
Figure 22:
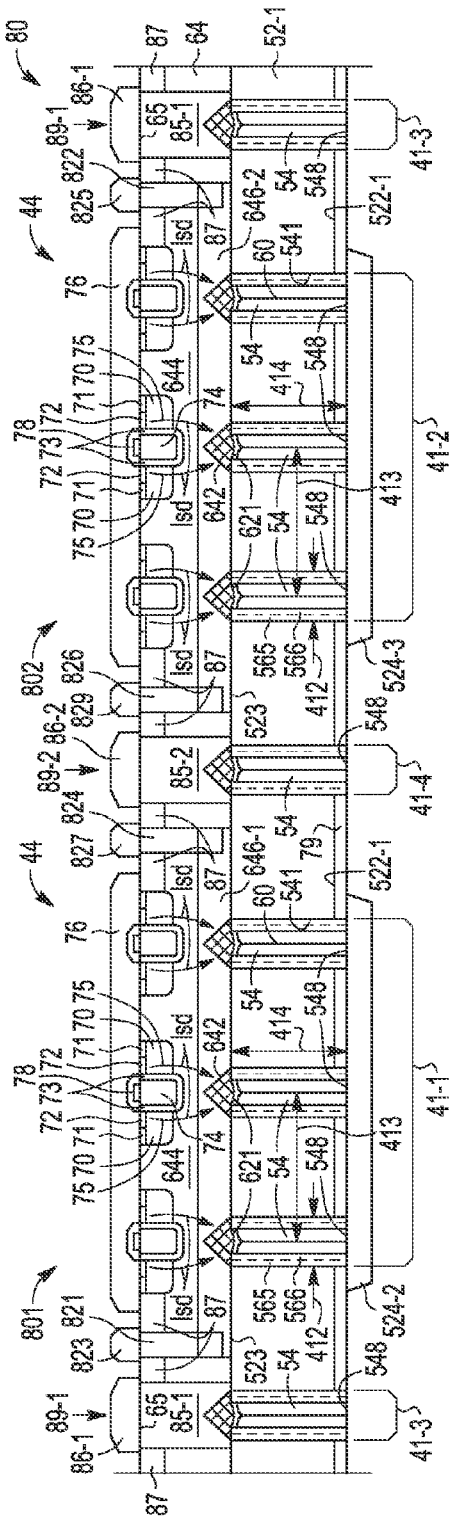
Figure 23:
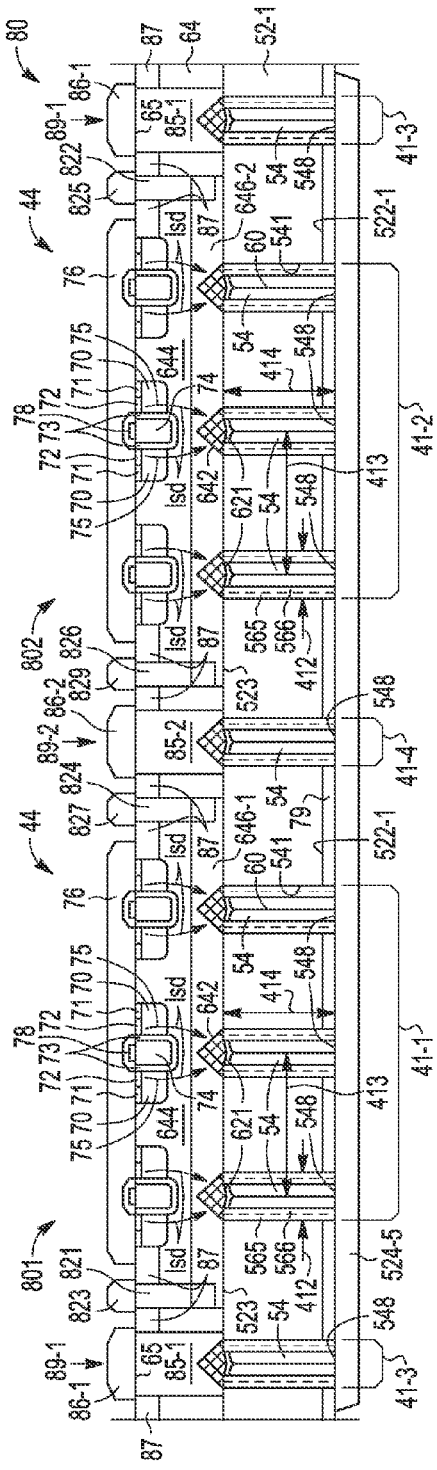

FIGS. 21-23 are simplified schematic cross-sectional views of element 40 of FIGS. 2-6 comprising devices 80 of FIGS. 18-20 according to yet still further embodiments of the present invention and illustrating how the structures and methods described herein may be used to advantage to obtain various other device and circuit configurations. Vertical channel MOSFETS 801, 802 (collectively 80) already described individually in connection with FIGS. 18-20 are illustrated in FIGS. 21-23 and reference should be had to FIGS. 18-20 and associated description for details of such devices. It should be kept in mind that vertical channel MOSFETS 80 are shown merely be way of example and not limitation, and that any type of device or combinations of devices 42 may be substituted in device regions 44 of structures 321-324 of FIGS. 21-23. Non-limiting examples of other devices included within the general designation "devices 42" are NMOS, PMOS and CMOS devices, LDMOS devices, VMOS devices, bipolar devices, resistors, capacitors, inductors, diodes, varactors, memories and so forth. Any of these and other types of devices 42 may be substituted for or combined with devices 80 of FIGS. 21-23.

Structure 321 of FIG. 21 illustrates two isolated vertical MOSFETS 801, 802 (collectively (80) formed in thinned substrate 52-1 with common backside contact 524-1, buried layers 646-1, 646-2 with N-type sinker regions 821, 822 extending to buried layers 646-1, 646-2 respectively, and with contacts 823, 824 respectively. Contacts 821, 822 may be included in some embodiments and omitted in others. In addition to conductor filled trenches 41-1, 41-2 (collectively 41) coupling buried layers 646-1, 646-2 to backside contact 524-1, enclosing conductor filled trench 41-3 (e.g., see also FIGS. 5-6) is provided laterally outboard of devices 801, 802 and sinkers 821, 822. Conductor filled enclosing trench 41-3 extends to P-type sinker regions 85-1 extending downward from surface 65 of SC (e.g., epi) layer 64 to contact the upper end of conductor 54 in enclosing trench 41-3. The combination of conductor filled enclosing trench 41-3 and sinker 85-1 forms isolation wall 89-1 that isolates devices 80 from other circuit elements laterally outside of isolation wall 89-1. Contact 86-1 may be provided to isolation wall 89-1 in some embodiments or omitted in others, depending upon whether or not isolation wall 89-1 needs to be separately biased or isolated. Conventional dielectric isolation regions 87 are desirably provided proximate surface 65 between the various device and sinker regions to inhibit surfaced leakage, but these may be omitted in other embodiments. When referring generally to, for example, thinned substrates and thinned backside surfaces, reference number 52 is intended to include 52-1 and reference number 522 is intended to include reference number 522-1, respectively. This convention is generally followed with respect to reference numbers to which suffixes (e.g., -1, -2, -3, -4, -5, etc.) are added to common reference numbers to particular identify different regions of, for example, similar construction or function (e.g., 52-1, 52-2; 522-1, 522-2; 646-1, 646-2, 41-1, 41-2 ... 41-6; 524-1, 524-2 ... 524-5; 548-1; 85-1, 85-2; 86-1, 86-2; 89-1, 89-2, etc.) in these and other FIGS., and such general reference numbers (e.g., 52, 522, 64, 41, 524, 548, 85, 86, 89, etc.) are intended to include those with a dashed suffix Structure 322 of FIG. 22 illustrates two isolated vertical MOSFETS 801, 802 (collectively (80) formed in thinned substrate 52-1 with separate backside contacts or conductors 524-2, 524-3. Buried layers 646-1, 646-2 with associated N-type sinker regions 821, 822, 824, 826 extending to buried layers 646-1, 646-2, and with contacts 823, 825, 827, 829 are desirably provided but may be omitted in other embodiments. Contacts 823, 825, 827, 820 may be included or omitted in still other embodiments. In addition to conductor filled trenches 41-1, 41-2 (collectively 41) coupling buried layers 646-1, 646-2 to backside contacts 524-2, 524-3, conductor filled enclosing trench 41-3 (e.g., see also FIGS. 5-6) is provided laterally outboard of devices 801, 802 and sinkers 821, 822, in generally the same manner as described in connection with FIG. 21. In addition, conductor filled trench 41-4 is provided located between devices 801, 802. Conductor filled enclosing trench 41-3 and intermediate trench 41-4 extend to P-type sinker regions 85-1, 85-2 extending downward from surface 65 of epi-layer 64 to be electrically coupled to the upper end of conductor 54 in trenches 41-3, 41-4. The combination of conductor filled trenches 41-3, 41-5 and sinkers 85-1, 85-2 form isolation walls 89-1, 89-2 that isolate and separate devices 801, 802 from each other and from other circuit elements laterally outside of isolation wall 89-1. Contact 86-1, 86-2 may be provided to one or both of isolation walls 89-1, 89-2 in some embodiments or omitted in others, depending upon whether or not isolation walls 89-1, 89-2 collectively or individually need to be biased either together or separately. Dielectric regions 87 are desirably provided proximate surface 65 between the various device and sinker regions to inhibit surfaced leakage. Referring now to FIG. 23, structure 323 is generally similar to structure 322 of FIG. 22 but has common backside conductor 424-4 coupling conductor filled trenches 41-1, 41-2 leading to buried layers 646-1, 646-2 as well as conductor filled isolation and separation trenches 41-3, 41-4 so that they are at a common potential. It will be understood by those of skill in the art that backside contacts and/or interconnects 524 may be arranged to couple any combination of vias 41 and that the embodiments illustrated here are merely by way of example and not limitation.

Figure 24:
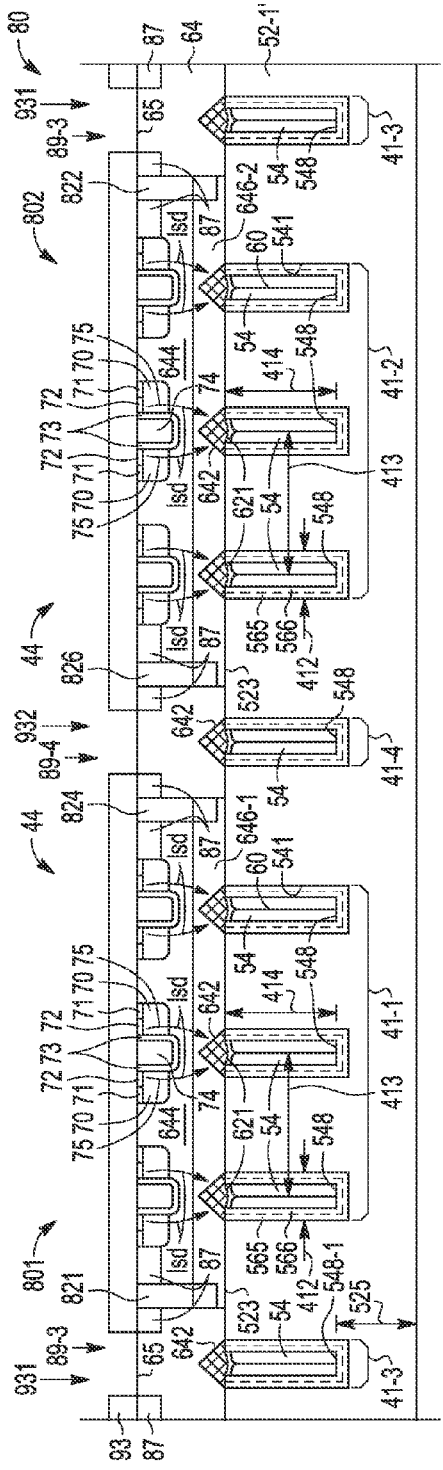

FIGS. 24-26 are simplified schematic cross-sectional views analogous to those of FIGS. 21-23 but according to additional embodiments of the invention and at various stages of manufacture. FIG. 24 illustrates structure 324 of manufacturing stage 124 wherein vias 41-1 ... 41-4 have been formed and substantially all of the high temperature operations needed to form devices 80 in SC layer 64 have been performed but substrate 52-1' has not yet been thinned. By way of example and not intended to be limiting, in FIG. 24 the various device regions within substrate 52-1 at or beneath surface 65 of SC layer 64 shown in FIG. 23 are also present with the exception of isolation sinkers 85-1 85-2 of structure 323 of FIG. 23. Stated another way, manufacturing stage 124 of FIG. 24 corresponds substantially to manufacturing stage 115 of FIG. 15 prior to formation of contacts and electrodes 46, 461, 48, 481 for exemplary devices 80. Substrate 52-1' of FIG. 24 has not yet been thinned so its mechanical robustness has not been compromised. In manufacturing stage 124 of FIG. 24, masking layer 93 is provided with openings 931-932 corresponding to the desired location of through vias 89-3, 89-4. Masking layer 93 is analogous to masking layer 53 of FIG. 7 and the discussion of masking layer 53 and manufacturing stage 107 should be referred to for further details. Structure 324 results.

Referring now to manufacturing stage 125 of FIG. 25, structure 324 is subjected to anisotropic etching to create cavities 94-1, 94-2 (collectively 94) extending from surface 65 to top portions 621 of cavities 41-5, 41-6 immediately beneath openings 931, 932. This is done in substantially the same manner as already described in connection with manufacturing stage 108 of FIG. 8 and the discussion thereof should be referred to for further details. Cavities 94-1, 94-2 are then lined with dielectric and seed layers in the same manner as has already been described. A brief anisotropic etch is performed prior to filling the cavities with conductor 95 to remove portions 568 of dielectric liner 56 (visible in analogous manufacturing stage 110 of FIG. 10) in the bottom of cavities 94-1, 94-2. Cavities 94-1, 94-2 are then filled with conductor 95 to form conductor filled cavities 94 in substantially the same manner as has already been described in connection with cavities 41 of manufacturing stages 109-114 of FIGS. 9-14. Conductor 95 in cavities 94-1, 942 makes Ohmic contact to conductor 54 in cavities 41 thereby providing highly conductive combined vias 96-1, 96-2. Structure 325 results. In other embodiments, portion 621 of barrier layer 62 may be omitted beneath cavities 94-1, 94-2.

In manufacturing stage 126 of FIG. 26, rear face 522' of substrate 521-1' of structure 325 is back-lapped or substrate 521-1' otherwise thinned in much the same manner as already described in connection with manufacturing stage 116 of FIG. 16 to expose new back-face or lower surface 522-1 (or 522) on thinned substrate 521-1, and the discussion thereof in connection with FIG. 16 should be consulted for further details. This thinning operation is preferably accomplished after all significant high temperature operations have been performed in connection with the fabrication of devices 80. Front-side metallization, interconnects or contacts 76, 78, 86-1, 86-2, 823, 825, 827, 829, etc., and their associated dielectric and/or passivation layers, can be applied before or after substrate thinning. After substrate thinning, rear-face or back-side contact, for example contact or electrode 524-6, is applied. In a preferred embodiment, insulating layer 79 is provided underneath rear electrode 524-6 where it is proximate rear face 522-1 of substrate 521-1 so as to insulate contact 524-6 from substrate 521-1, but layer 79 may be omitted in other embodiments. In the example of FIG. 26, through-via 96-1 resulting from the combination of partial vias 41-5 and 94-1 has contract 86-1 in some embodiments but may otherwise be left floating or coupled to back-side electrode 524-6 in other embodiments. Further, through-via 96-2 resulting from the combination of partial vias 41-6 and 94-2 has contract 86-2 in some embodiments and is Ohmically coupled to back-side contact 524-6 but may be differently coupled in other embodiments. Persons of skill in the art will understand that back-side electrode 524-6 may contact and/or interconnect one or more or all of vias 41-1, 41-2, 41-5, 412-6 in any desired combination. Structure 326 results.

It will be appreciated that the foregoing description illustrates how the method and structure of various embodiments of the present invention may be employed to provide very low resistance back-side connections to electronic elements, particularly SC devices without compromising the structural robustness of the substrates during manufacturing, especially during high temperature manufacturing steps that may be used to form various SC devices and other electronic elements. Further, the described structures and method of various embodiments can provide high conductivity vias that extend entirely through the substrate. In addition, the vias described herein can provide low resistance front side contacts to be made to power devices. This facilitates their incorporation into more complex integrated circuits rather than having to be provided on separate chips as has been the custom in the past. The partial vias (e.g., vias 41, 95 and/or vias 41 combined with sinkers 85) or through-vias (e.g., vias 96) may also serve as isolation walls to electrically isolate certain SC devices from other devices on the same die or substrate. These are significant advances in the art.

According to a first embodiment, there is provided a method for forming an electronic element (40), comprising, providing an initial substrate (52') comprising a semiconductor and of an initial thickness (521') between an initial first surface (523) and an opposed initial second surface (522'), forming one or more pipes or trenches (411) extending into the initial substrate (52') from the initial first surface (523) by a distance (414) less than the initial thickness (521'), substantially filling the pipes or trenches (411) with a conductor (54) to form conductor filled pipes or trenches (41), forming a semiconductor layer (64) over the initial first surface (523) and the conductor filled pipes or trenches (41) wherein the semiconductor layer (64) comprises a region (44) adapted for device formation and having a new first surface, forming one or more semiconductor devices (42, 80) in the device region (44), thinning the initial substrate (52') by removing material from the initial second surface (522') thereby providing a thinned substrate (52) with a new second surface (522, 522-1) with one or more lower faces (548) of the conductor (54) in the conductor filled pipes or trenches (41) exposed thereon, and providing a conductor (524) supported by the new second surface (522, 522-1) making Ohmic contact to the one or more lower faces (548) of the conductor (54) in the conductor filled pipes or trenches (41). According to a further embodiment, the method further comprises, prior to the step of substantially filling the pipes or trenches (411) with a conductor (54), substantially conformally coating the pipes or trenches (411) with a dielectric comprising layer (56). According to a still further embodiment, the dielectric comprising layer (56) comprises a first electrically insulating layer (561) and a second barrier layer (563). According to a yet further embodiment, the second barrier layer (563) comprises nitrogen. According to a still yet further embodiment, the second barrier layer (563) further comprises titanium. According to a yet still further embodiment, the initial substrate (52') has a first thermal coefficient of expansion ($TCE_{52}$) and the conductor (54) has a second thermal coefficient of expansion ($TCE_{54}$) and a ratio $R=(TCE_{54})/(TCE_{52})$ is less than or equal about 3. According to another embodiment, R is less than or equal about 2. According to a still another embodiment, R is less than or equal about 1.5. According to a yet another embodiment, the conductor (54) comprises tungsten. According to a still yet another embodiment, the method further comprises prior to the step of substantially filling the pipes or trenches (411) with a conductor (54), substantially coating the dielectric comprising layer (56) with a further layer (58) adapted to act as a seed layer for localized deposition of the conductor (54). According to a yet still another embodiment, the method further comprises prior to the step of substantially filling the pipes or trenches (411) with a conductor (54), anisotropically etching the further layer (58) to substantially remove portions thereof not on portions of the dielectric comprising layer (56) on interior sidewalls (541) of the pipes or trenches (411). According to an additional embodiment, the method further comprises prior to forming the semiconductor layer (64), providing a barrier region (621) above the conductor (54) in the conductor filled pipes or trenches (41) adapted to prevent direct contact between the conductor (54) and the semiconductor layer (64). According to a still additional embodiment, the barrier region (621) is electrically conductive.

According to a second embodiment, there is provided an electronic element (40) having a font-side (65) and a final backside (522) and having one or more electronic devices (42, 80) proximate the front-side (65) from which current flows to the final backside (522) of the element (40), comprising, a substrate (52) having an upper surface (523) and having an initial lower surface (522') and having a final lower surface (522, 522-1) forming the final backside (522, 522-1), the final lower surface (522, 522-1) being displaced from the initial lower surface (522'), and one or more conductor filled pipes or trenches (41) electrically coupled to the one or more electronic devices (42, 80) and extending between the upper surface (523) and the final backside (522, 522-1) for substantially conducting the current flowing from the one or more electronic devices to the final backside (522, 522-1) of the element (40), an epitaxial layer (64) on the upper surface (523) and over the one or more conductor filled trenches (41) extending from the upper surface (523) to the front side (65) of the element (40), such epitaxial layer (64) being adapted to substantially contain the one or more electronic devices (42, 80), and wherein the one or more conductor filled pipes or trenches, the epitaxial layer (64) and the one or more electronic devices (42, 80) are substantially formed prior to removing material from the initial lower surface (522') to form the final backside (522). According to a further embodiment, the element (40) further comprises one or more isolation walls or separators (89) formed from further conductor filled trenches (41) extending at least from the upper surface (523) to the final backside (522, 522-1). According to a still further embodiment, at least some of the one or more isolation walls or separators (89) lie laterally outside of the one or more electronic devices (42, 80). According to a yet still further embodiment, at least some (96) of the one or more isolation walls (41) extend substantially between the final backside (522, 522-1) and the front-side (65) of the electronic element (40). According to a still yet further embodiment, the conductor filled trenches (41) have an insulating liner (565).

According to a third embodiment, there is provided a method of forming an electronic device, comprising, providing a substrate (52', 52-1') having a front surface (523) and an initial back surface (522') in which substrate (52', 52-1') conductor filled vias (41) have been provided extending substantially from the front surface (523) part-way through the substrate (52', 52-1') to a predetermined thickness (525) from the initial back surface (522'), providing a semiconductor layer (64) overlying the front surface (523) and the conductor filled cavities (41), forming one or more devices (42, 80) in the semiconductor layer (64), removing the predetermined thickness (525) of substrate (52', 52-1') from the initial back surface (522') thereby exposing a final back surface (522, 522-1) on which one or more of the conductor filled vias (41) is exposed, and providing an electrical conductor in Ohmic contact with the one or more of the conductor filled vias (41) exposed on the final back surface (522, 522-1). According to a further embodiment, the method further comprises interposing an electrically conductive barrier region between the semiconductor layer (64) and the conductor filled vias (41).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic element having a front-side and a final backside and having one or more electronic devices proximate the front-side from which current flows to the final backside of the element, comprising:
a substrate having an upper surface and having an initial lower surface and having a final lower surface forming the final backside, the final lower surface being displaced from the initial lower surface, and one or more conductor filled pipes or trenches electrically coupled to the one or more electronic devices and extending between the upper surface and the final backside for substantially conducting the current flowing from the one or more electronic devices to the final backside of the element;
an epitaxial layer on the upper surface and over the one or more conductor filled trenches extending from the upper surface to the front side of the element, such epitaxial layer being adapted to substantially contain the one or more electronic devices; and
wherein the one or more conductor filled pipes or trenches, the epitaxial layer and the one or more electronic devices are substantially formed prior to removing material from the initial lower surface to form the final backside.

2. The electronic element of claim 1, further comprising one or more isolation walls or separators formed from further conductor filled trenches extending at least from the upper surface to the final backside.

3. The electronic element of claim 2, wherein at least some of the one or more isolation walls or separators lie laterally outside of the one or more electronic devices.

4. The electronic element of claim 3, wherein at least some of the one or more isolation walls extend substantially between the final backside and the front-side of the electronic element.

5. The electronic element of claim 1, wherein the conductor filled trenches have an insulating liner.

6. An electronic element comprising:
a thinned substrate comprising a semiconductor, wherein the thinned substrate had an initial thickness between an initial first surface and an opposed initial second surface prior to thinning, and the thinned substrate has a final thickness between the initial first surface and a new second surface less than the initial thickness due to removal of material from the initial second surface after thinning;
one or more pipes or trenches previously extending into the initial substrate from the initial first surface by a distance less than the initial thickness and greater than the final thickness, wherein the pipes or trenches are filled with a conductor to form conductor filled pipes or trenches, and one or more lower faces of the conductor in the conductor filled pipes or trenches is exposed at and coplanar with the new second surface;
a semiconductor layer over the initial first surface and the conductor filled pipes or trenches, wherein the semiconductor layer comprises a region adapted for device formation and having a new first surface;
one or more semiconductor devices formed in the device region; and
a conductor supported by the new second surface making Ohmic contact to the one or more lower faces of the conductor in the conductor filled pipes or trenches.

7. The electronic element of claim 6, wherein the pipes or trenches are conformally coated with a dielectric comprising layer.

8. The electronic element of claim 7, wherein the dielectric comprising layer comprises a first electrically insulating layer and a second barrier layer.

9. The electronic element of claim 8, wherein the second barrier layer comprises nitrogen.

10. The electronic element of claim 9, wherein the second barrier layer further comprises titanium.

11. The electronic element of claim 7, wherein the dielectric comprising layer is coated with a further layer adapted to act as a seed layer for localized deposition of the conductor.

12. The electronic element of claim 6, wherein the thinned substrate has a first thermal coefficient of expansion ($TCE_{52}$) and the conductor has a second thermal coefficient of expansion ($TCE_{54}$) and a ratio $R=(TCE_{54})/(TCE_{52})$ is less than or equal about 3.

13. The electronic element of claim 12, wherein R is less than or equal about 2.

14. The electronic element of claim 13, wherein R is less than or equal about 1.5.

15. The electronic element of claim 6, wherein the conductor comprises tungsten.

16. The electronic element of claim 6, further comprising a barrier region above the conductor in the conductor filled pipes or trenches adapted to prevent direct contact between the conductor and the semiconductor layer.

17. The electronic element of claim 16, wherein the barrier region is electrically conductive.

18. An electronic device comprising:
a thinned substrate which had an initial thickness between a front surface and an initial back surface prior to thinning the substrate, and the thinned substrate has a final thickness, after thinning, between the front surface and a final back surface, wherein the final thickness is less than the initial thickness due to removal of material from the initial back surface during thinning;
conductor filled vias previously extending, prior to thinning the substrate, substantially from the front surface part-way through the substrate to a predetermined thickness from the initial back surface, wherein one or more lower faces of the conductor filled vias is exposed at and coplanar with the final back surface;
a semiconductor layer overlying the front surface and the conductor filled vias;
one or more devices in the semiconductor layer; and
an electrical conductor in Ohmic contact with the one or more of the conductor filled vias exposed on the final back surface.

19. The electronic device of claim 18, further comprising an electrically conductive barrier region interposed between the semiconductor layer and the conductor filled vias.

* * * * *